(12) United States Patent
Imai et al.

(10) Patent No.: US 12,431,325 B2
(45) Date of Patent: Sep. 30, 2025

(54) SAMPLE IMAGE OBSERVATION DEVICE AND METHOD FOR SAME

(71) Applicant: Hitachi High-Tech Corporation, Tokyo (JP)

(72) Inventors: Yuta Imai, Tokyo (JP); Junichi Katane, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 448 days.

(21) Appl. No.: 17/928,691

(22) PCT Filed: Jul. 14, 2020

(86) PCT No.: PCT/JP2020/027381
§ 371 (c)(1),
(2) Date: Nov. 30, 2022

(87) PCT Pub. No.: WO2022/013945
PCT Pub. Date: Jan. 20, 2022

(65) Prior Publication Data
US 2023/0230799 A1 Jul. 20, 2023

(51) Int. Cl.
H01J 37/22 (2006.01)
H01J 37/26 (2006.01)
H01J 37/28 (2006.01)

(52) U.S. Cl.
CPC .......... *H01J 37/222* (2013.01); *H01J 37/265* (2013.01); *H01J 37/28* (2013.01); *H01J 2237/226* (2013.01); *H01J 2237/24578* (2013.01)

(58) Field of Classification Search
CPC .......... H01J 37/00; H01J 37/02; H01J 37/222; H01J 37/265; H01J 37/28; H01J 37/26; H01J 2237/226; H01J 2237/24578
(Continued)

(56) References Cited

U.S. PATENT DOCUMENTS

2015/0371815 A1 12/2015 Potocek et al.
2017/0169992 A1 6/2017 Kobayashi et al.
(Continued)

FOREIGN PATENT DOCUMENTS

JP 2016-004785 A 1/2016
JP 2016-15252 A 1/2016
(Continued)

OTHER PUBLICATIONS

Korean Office Action received in corresponding Korean Application No. 10-2022-7044504 dated Nov. 15, 2024.
(Continued)

*Primary Examiner* — Jason L McCormack
(74) *Attorney, Agent, or Firm* — Mattingly & Malur, PC

(57) ABSTRACT

Provided is a sample image observation device including an SEM and a control system configured to control the SEM. An observation region of a sample is divided into a plurality of sections, and restoration processing is performed on an image which is acquired by irradiating each section with a sparse electron beam, based on scanning characteristics in the section. A reduction in quality of a restored image due to a beam irradiation position deviation caused by a scanning response is prevented and restoration with high accuracy and high throughput under a condition for preventing sample damage is possible.

10 Claims, 6 Drawing Sheets

(58) Field of Classification Search
USPC .......................................... 250/306, 307, 311
See application file for complete search history.

(56) References Cited

U.S. PATENT DOCUMENTS

2020/0211820 A1*  7/2020  Lyons .................... H01J 37/045
2022/0005667 A1*  1/2022  Tamaki ................. H01J 37/153

FOREIGN PATENT DOCUMENTS

JP    2019-525408 A    9/2019
WO    2018/017715 A1   1/2018

OTHER PUBLICATIONS

International Search Report of PCT/JP2020/027381 dated Sep. 24, 2020.

* cited by examiner

[FIG. 1]
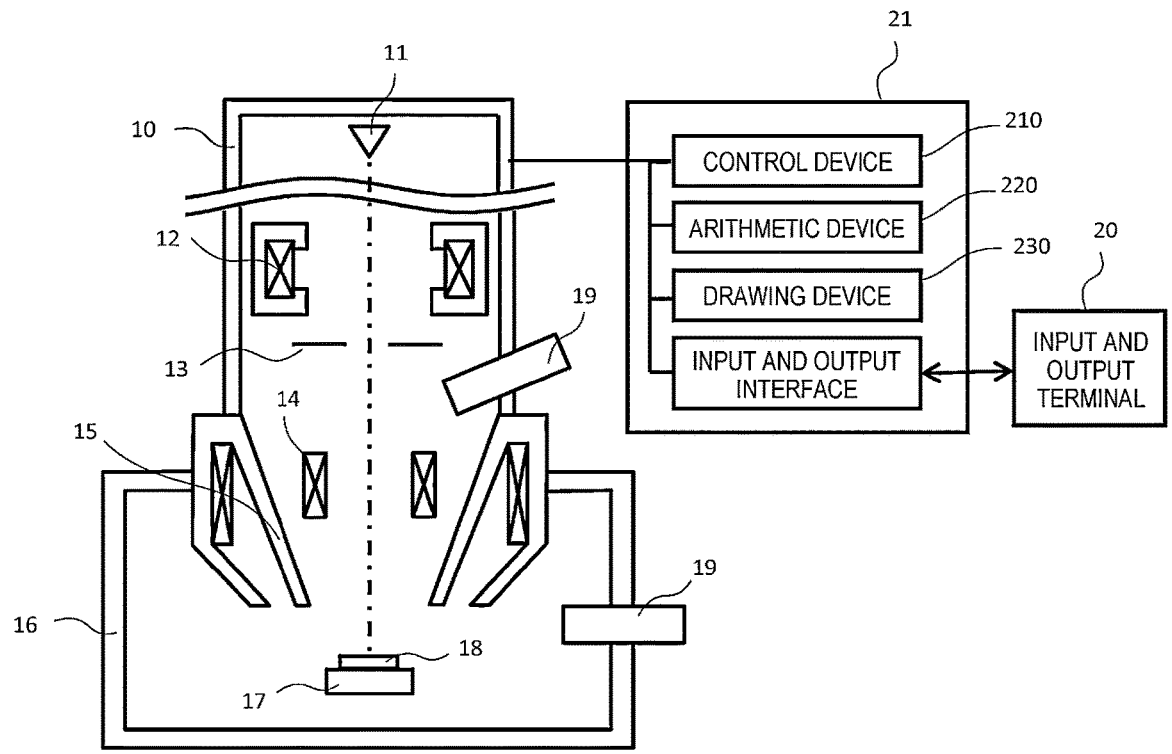
[FIG. 2]
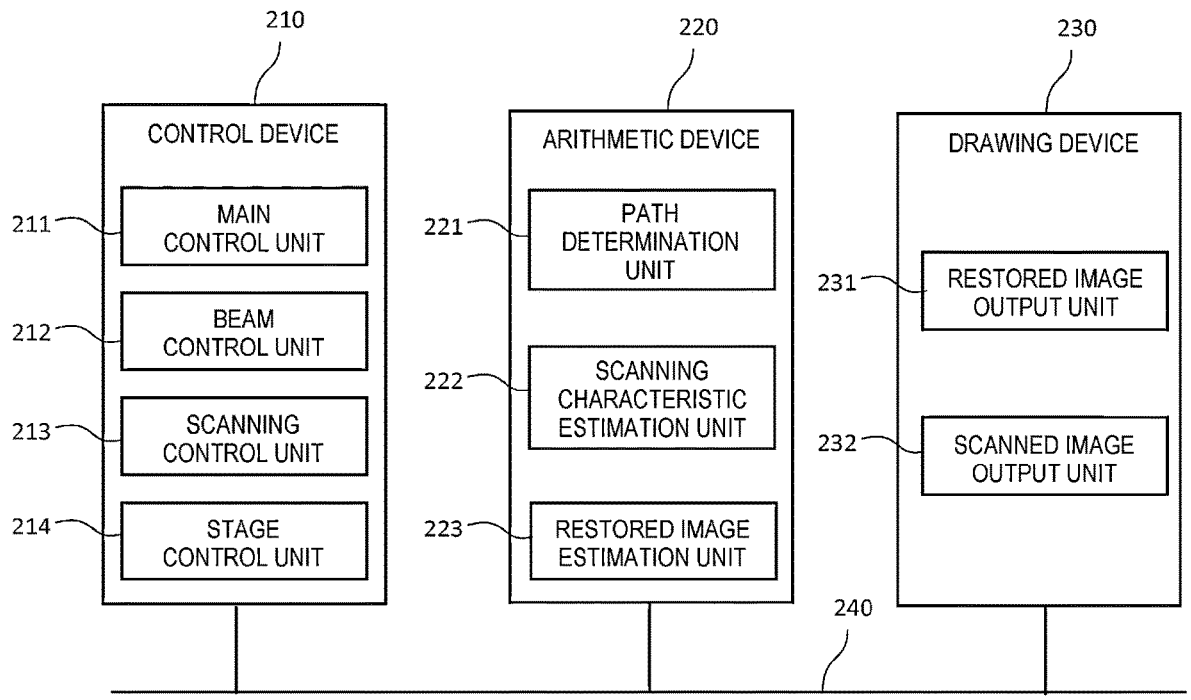

[FIG. 3]
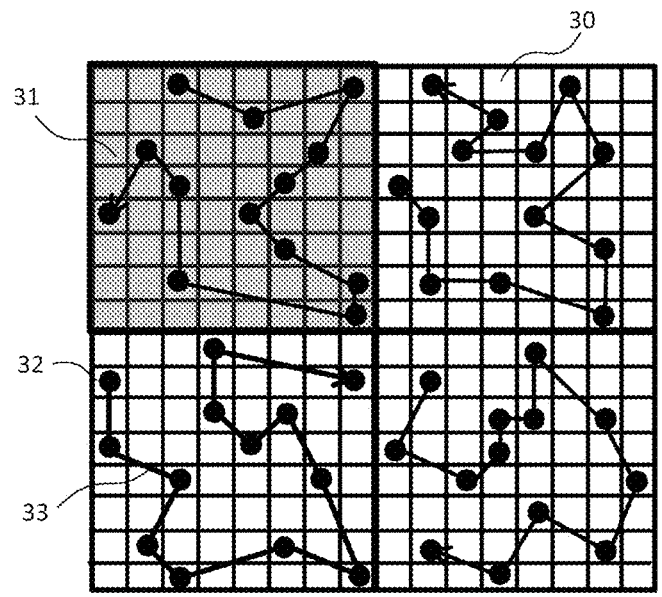
[FIG. 4]
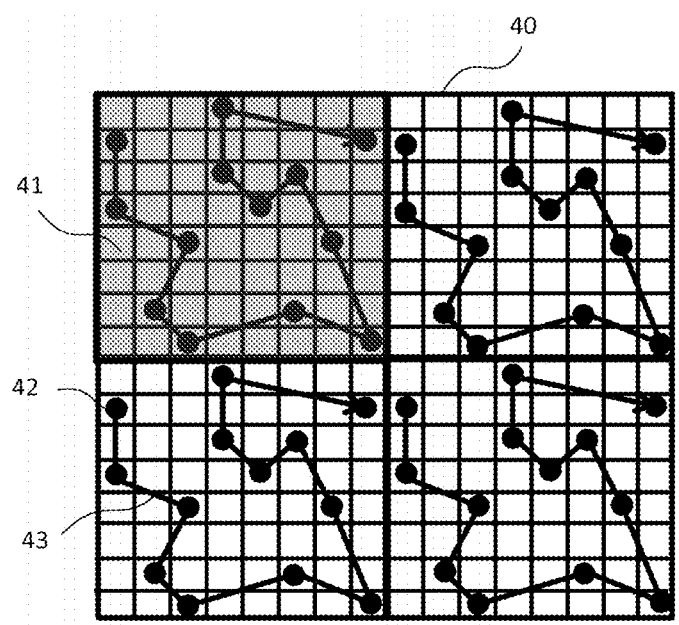

[FIG. 5]
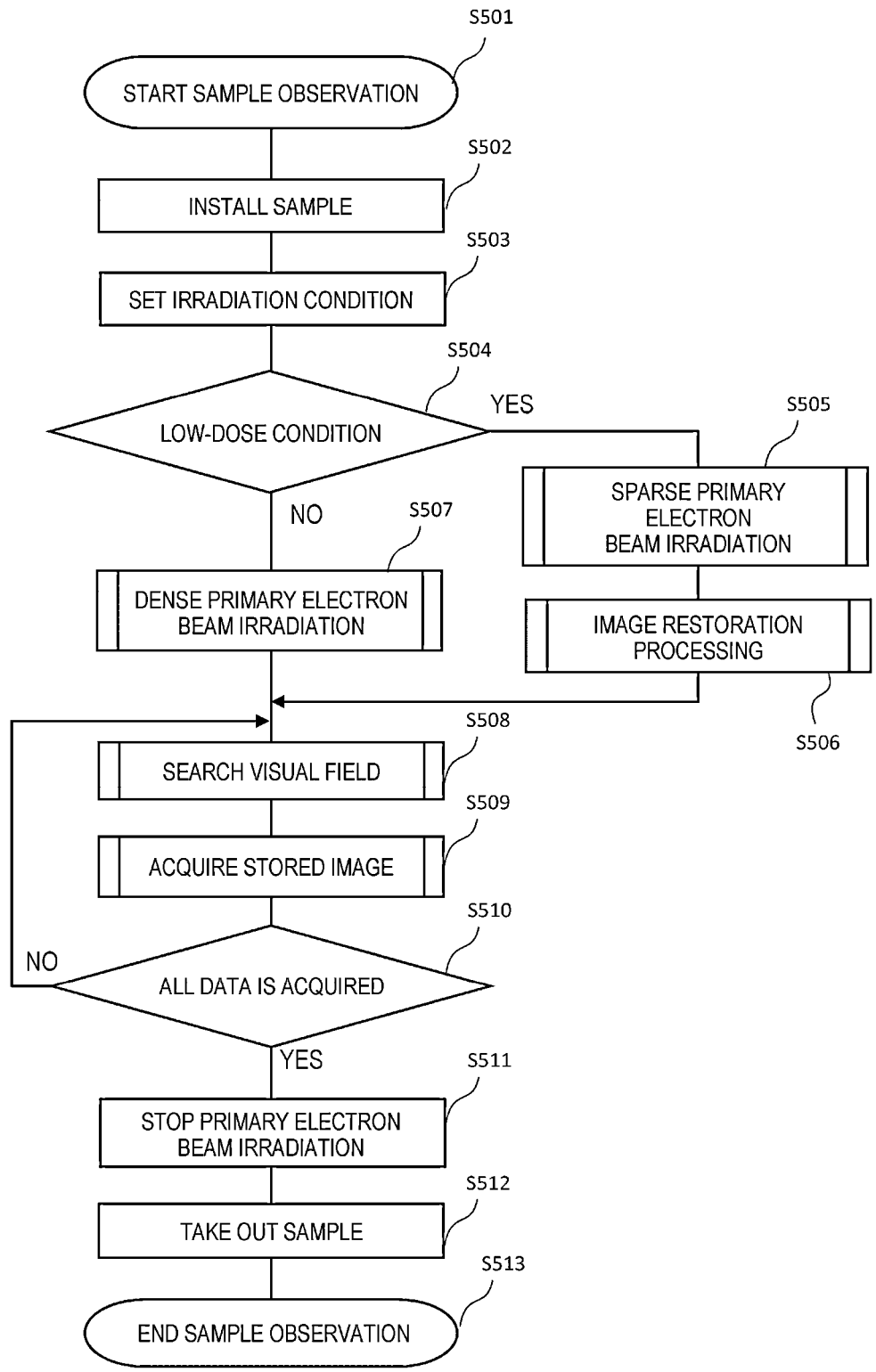

[FIG. 6]
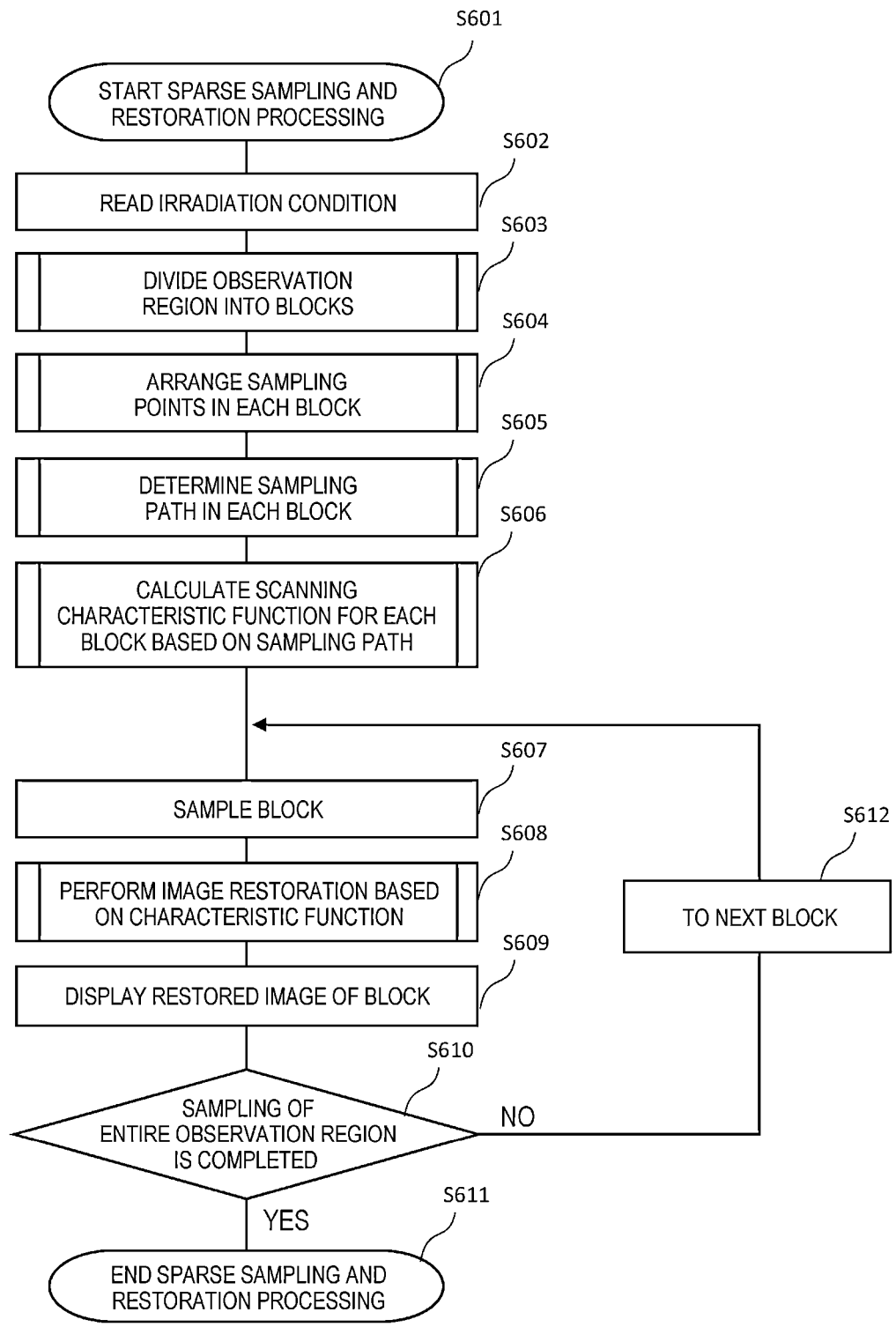

[FIG. 7]
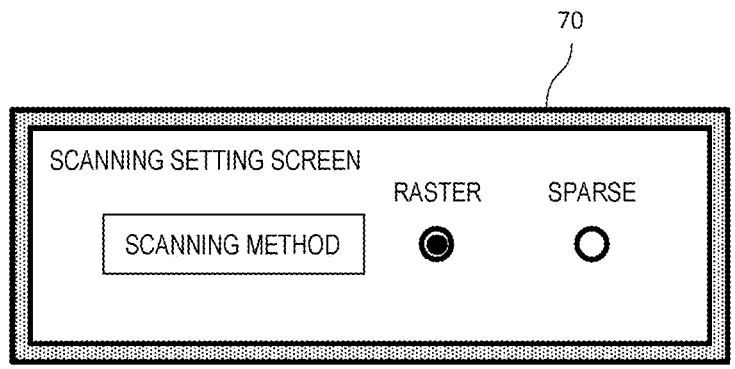
[FIG. 8]
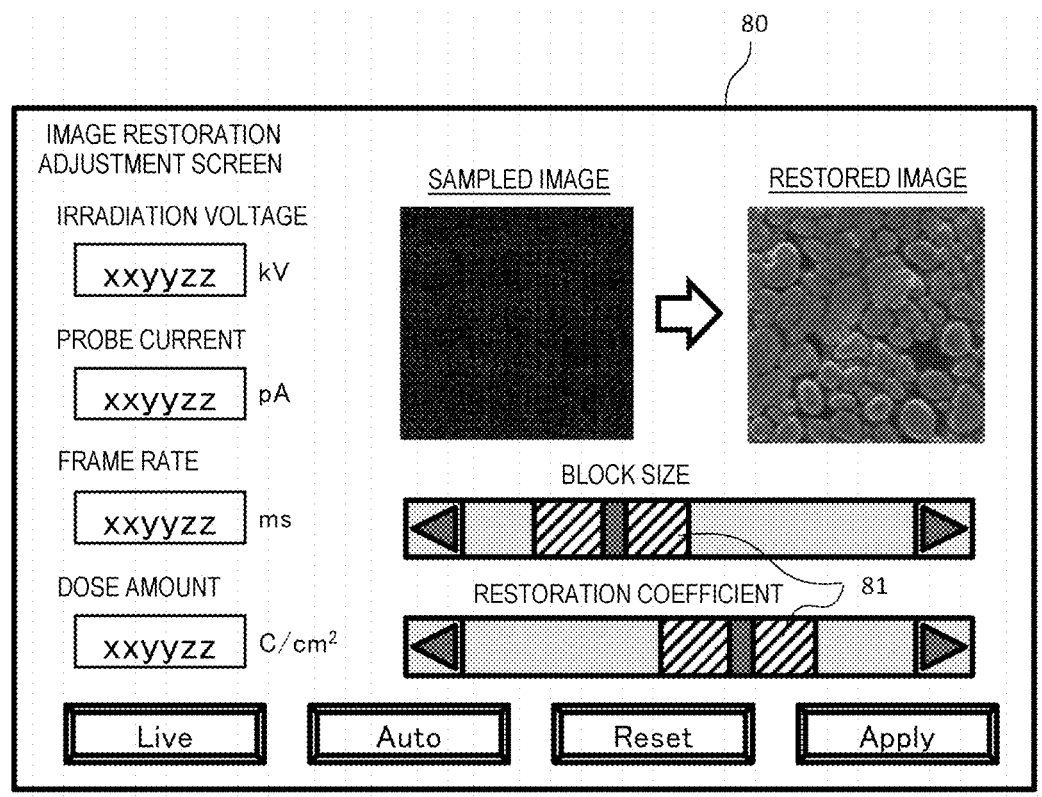

[FIG. 9]
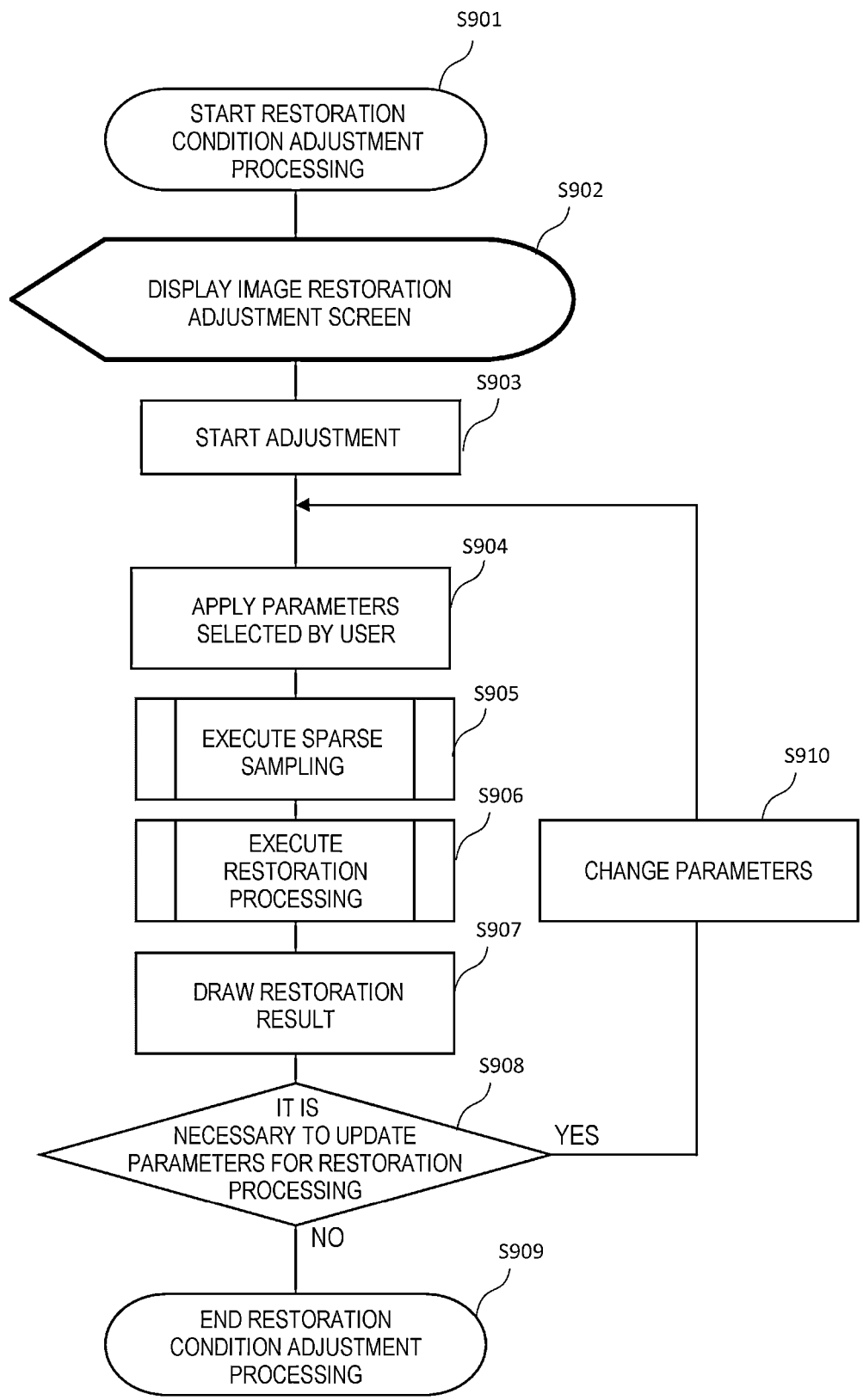

SAMPLE IMAGE OBSERVATION DEVICE AND METHOD FOR SAME

TECHNICAL FIELD

The present invention relates to a sample image observation device, and more particularly, to a sample image observation technique for implementing low-damage observation.

BACKGROUND ART

In a scanning electron microscope (SEM), as one of methods for implementing low-damage observation, there is a method for restoring original information by computer processing based on a sparsely sampled image obtained by applying compression sensing (CS) and irradiating only a limited point of a sample with an electron beam. In this method, it is necessary to implement appropriate sparse sampling in order to restore a sample image with high accuracy and high throughput. As a sparse sampling method in such an SEM, moving velocity modulation executed by a scanning coil can be used, but there are problems that a resolution of a restored image is reduced and that an artifact caused by a scanning pattern is generated due to a beam irradiation position deviation caused by responsiveness of a blanker or a coil.

As a related art document related to such a sample image observation technique, there is, for example, PTL 1, which discloses that an influence of a response delay is reduced by sampling only adjacent pixels according to a sparse sampling method in which random hopping is performed on a line.

CITATION LIST

Patent Literature

PTL 1: JP2019-525408A

SUMMARY OF INVENTION

Technical Problem

In the technique disclosed in PTL 1, since the sampling is integrated one-dimensionally, a resolution of a restored image may be reduced and an artifact may become apparent.

An object of the invention is to provide a sample image observation device and a method for the same, which solve the problems in the sample image observation technique described above and implement sparse sampling enabling restoration with high accuracy and high throughput.

Solution to Problem

In order to achieve the above object, the invention provides a sample image observation device in which an observation region of a sample is divided into a plurality of sections, and restoration processing is performed on an image which is acquired by irradiating each section with a sparse electron beam, based on scanning characteristics in the section.

In addition, in order to achieve the above object, the invention provides a sample image observation method using a scanning electron microscope, in which an observation region of a sample is divided into a plurality of sections, and restoration processing is performed on an image which is acquired by irradiating each section with a sparse electron beam, based on scanning characteristics in the section.

Advantageous Effects of Invention

A reduction in quality of a restored image due to a beam irradiation position deviation caused by a scanning response is prevented and restoration with high accuracy and high throughput under a condition for preventing sample damage is possible.

BRIEF DESCRIPTION OF DRAWINGS

FIG. 1 is a diagram showing a configuration example of a sample image observation device according to a first embodiment.

FIG. 2 is a diagram showing a main part of a control system of the sample image observation device according to the first embodiment.

FIG. 3 is a diagram showing an example of an electron beam irradiation path in a section according to the first embodiment.

FIG. 4 is a diagram showing another example of the electron beam irradiation path in the section according to the first embodiment.

FIG. 5 is a diagram showing an example of a sample observation flow executed by the sample image observation device according to the first embodiment.

FIG. 6 is a diagram showing an example of a flow of sparse sampling and restoration processing executed by the sample image observation device according to the first embodiment.

FIG. 7 is a diagram showing an example of a scanning setting screen of the sample image observation device according to the first embodiment.

FIG. 8 is a diagram showing an example of an image restoration adjustment screen of the sample image observation device according to the first embodiment.

FIG. 9 is a diagram showing an example of a flow of restoration condition adjustment processing executed by the sample image observation device according to the first embodiment.

DESCRIPTION OF EMBODIMENTS

Hereinafter, embodiments for carrying out the invention will be described with reference to the drawings.

First Embodiment

A first embodiment is an embodiment of a sample image observation device having a configuration in which an observation region of a sample is divided into a plurality of sections, and restoration processing is performed on an image which is acquired by irradiating each section with a sparse electron beam, based on scanning characteristics in the section.

FIG. 1 shows a configuration example of the sample image observation device according to the first embodiment. In FIG. 1, a primary electron beam (probe electron beam) from an electron gun 11 installed inside a scanning electron microscope body (SEM column) 10 passes through a condenser lens 12 and an aperture 13, is deflected by a scanning deflector 14, passes through an objective lens 15, and scans a surface of a sample 18 on a stage 17. Secondary electrons (signal electrons) generated from the sample 18 are detected by a detector 19, detection signals of the secondary electrons are sent to a control system 21, and an image of the surface of the sample 18 is restored.

FIG. 2 is a diagram showing a main part of a functional configuration of the control system of the sample image observation device according to the first embodiment. The control system can be implemented by executing various programs on a personal computer (PC) or the like.

As shown in FIG. 2, the control system 21 includes a control device 210, an arithmetic device 220, and a drawing device 230, which are connected to a bus 240. The control device 210 controls the SEM and includes a main control unit 211, a beam control unit 212, a scanning control unit 213, and a stage control unit 214.

The arithmetic device 220 includes a path determination unit 221 that determines a path of the primary electron beam, a scanning characteristic estimation unit 222, and a restored image estimation unit 223. The scanning characteristic estimation unit 222 estimates the scanning characteristics in each section, and the restored image estimation unit 223 estimates a restored image by computer processing in consideration of the scanning characteristics. The drawing device 230 includes a restored image output unit 231 and a scanned image output unit 232, obtains a scanned image using the restored image estimated by the restored image estimation unit 223, and performs sequential drawing on each section. Output of the scanned image output unit 232 is sent to a display unit of an input and output terminal 20.

In the present embodiment, a size of the section is determined based on an irradiation condition of the electron beam for irradiation. That is, the size of the section is determined based on a dose amount of the primary electron beam. Alternatively, the size of the section is determined based on a spatial distribution of sampling points which are focal point positions of the primary electron beam, that is, an irradiation ratio or irradiation density. Alternatively, the size of the section is determined based on a stay time and a dwell time per pixel of the primary electron beam for irradiation. Therefore, when the irradiation condition such as the dose amount, the irradiation ratio, and the dwell time is determined, an upper limit of the size of the section is determined from a viewpoint of a processing speed, and a lower limit of the size of the section is determined from a viewpoint of restoration accuracy.

An upper limit value of the size of the section is determined, for example, by comparing a total time required for sampling in the section with a processing time for image restoration based on sampling data in the section. By determining the size of the section such that the processing time for image restoration is shorter than the total time for sampling, real-time drawing can be implemented. At this time, the processing time for image restoration also includes a time required for irradiation path determination in the section and scanning characteristic estimation. As the number of sampling points included in the section increases, the processing time required for the irradiation path determination and the scanning characteristic estimation also increases.

A lower limit value of the size of the section is determined, for example, by providing a threshold in consideration of a statistical variation in the number of sampling points in the section. For example, when a threshold t is set, the size of the section in a case of an irradiation ratio p serving as the irradiation condition is determined such that a total number of pixels N in the section satisfies the following Formula 1. At this time, the threshold t is a value of 1 or more, and is preferably, for example, 10 or more.

[Math.1]

$$pN - \sqrt{pN} > t \quad (1)$$

In the SEM, when restoration is performed based on a sparsely sampled image, it is necessary to handle scanning response characteristics at the time of sampling. By obtaining a scanning characteristic function based on the sampling points and the path for each of the divided sections and superimposing the scanning characteristic functions at the time of restoration, it is possible to implement highly accurate restoration with throughput that enables sequential drawing. The scanning characteristic estimation unit 222 and the restored image estimation unit 223 can reduce artifacts by, for example, estimating a restored image using a sampling matrix that simulates a transient response of a scanning coil of the scanning deflector 14. An example of a formula used for calculating the transient response is shown in Formula 2.

[Math.2]

$$I = I_0(1 - \exp(-t/T)) \quad (2)$$

$$T = L/R$$

FIGS. 3 and 4 show examples of an electron beam irradiation path in a section of the sample, that is, in a block of the sample. Observation regions 30 and 40 shown in FIGS. 3 and 4 include a plurality of blocks 31 and 41 respectively, and each of the blocks 31 of the observation region 30 and each of the blocks 41 of the observation region 40 are sequentially scanned by sampling points 32 and sampling points 42 along sampling paths 33 and 43 respectively.

In cases of FIGS. 3 and 4, each block 31 and each block 41 has one sampling path 33 and one sampling path 43 respectively. A sparsely sampled image is formed by the signal electrons detected by the detector 19. Positions of the sampling points and the sampling path may be different or the same for each block.

FIG. 3 shows an example in which positions of the sampling points and the sampling path are different for each block. That is, an irradiation position and an irradiation path of the electron beam with which the section is irradiated are different for each section. In this case, randomness of the sampling increases, and quality of the restored image is expected to be improved.

FIG. 4 shows an example in which positions of the sampling points and the sampling path are the same for each block. That is, the irradiation position and the irradiation path of the electron beam with which the section is irradiated are the same for each section. In this case, since the scanning characteristics in each block can be considered to be the same, calculation for deriving the scanning characteristics can be performed only once, which leads to an improvement in the processing speed at the time of restoration.

FIG. 5 shows an example of a sample observation flow executed by the sample image observation device according to the present embodiment. In FIG. 5, when sample observation is started (S501), the sample is installed on the stage 17 (S502) and an irradiation condition is set (S503). Then, it is checked that whether the irradiation condition is a low-dose condition (S504), when the irradiation condition is the low-dose condition (YES), sparse primary electron beam irradiation is performed (S505), and image restoration processing based on the detection signals is executed (S506). Here, an irradiation amount in the case of the low-dose condition is about 10% to 20% of that in a case of a dense-dose condition.

On the other hand, when the irradiation condition is not the low-dose condition (NO), dense primary electron beam irradiation is performed (S507), a visual-field search (S508) and stored image acquisition (S509) are repeated, and it is checked whether all data is acquired (S510). When all the data is acquired (YES), the primary electron beam irradiation is stopped (S511), the sample is taken out (S512), and the sample observation is ended (S513).

FIG. 6 shows an example of a flow of sparse sampling and restoration processing according to the present embodiment. In FIG. 6, when the sparse sampling and the restoration processing are started (S601), the irradiation condition is read (S602), and then the observation regions 30 and 40 described in FIGS. 3 and 4 are divided into blocks (S603), a plurality of sampling points 32 and a plurality of sampling points 42 are arranged in the blocks 31 and 41 respectively (S604), the sampling paths 33 and 43 in the blocks are determined (S605), and the scanning characteristic function for each block is calculated based on the sampling path (S606). Thereafter, the block is sampled (S607), the image restoration is performed based on the characteristic function (S608), the restored image of the block is displayed (S609), and it is determined whether sampling of an entire observation region is completed (S610). When it is determined that the sampling is completed (YES), the sparse sampling and the restoration processing are ended (S611), and when it is determined that the sampling is not completed (NO), the process proceeds to a next block (S612).

FIG. 7 is a diagram showing an example of a scanning setting screen of the sample image observation device according to the present embodiment. As shown in FIG. 7, a user can select, as a scanning method, one of raster which is a dense scan and sparse which is a sparse scan by using a scanning setting screen 70 displayed on the display unit of the input and output terminal 20.

FIGS. 8 and 9 are diagrams showing restoration condition adjustment processing in the present embodiment, FIG. 8 shows an example of an image restoration adjustment screen, and FIG. 9 shows an example of a flow of the restoration condition adjustment processing.

In an image restoration adjustment screen 80 of FIG. 8, an irradiation voltage, a probe current, a frame rate, and a dose amount, which are adjustment parameters, can be set. A sampled image and a restored image can be displayed on the image restoration adjustment screen. Further, recommended regions 81 indicating a recommended block size and a recommended restoration coefficient are shown.

In the flow of the restoration condition adjustment processing shown in FIG. 9, when the restoration condition adjustment processing is started (S901), the image restoration adjustment screen 80 is displayed on the display unit of the input and output terminal 20 connected to the control system 21 (S902), and an adjustment is started (S903). Then, the parameters selected by the user using the screen are applied (S904), the sparse sampling is executed (S905), the restoration processing is executed (S906), and a restoration result is drawn (S907).

The user views the drawn restored image and determines whether it is necessary to update the parameters for restoration processing (S908). When it is determined to be unnecessary (NO), the restoration condition adjustment processing is ended (S909), and when it is determined to be necessary (YES), the parameters are changed (S910), and the restoration processing is executed again. In the image restoration adjustment screen 80, various function buttons such as [Live], [Auto], [Reset], and [Apply] are displayed for the user to perform image restoration adjustment.

According to the sample image observation device and the sample image observation method of the present embodiment described above, it is possible to perform observation and analysis with high accuracy under a condition for preventing sample damage.

The invention is not limited to the embodiment described above, and includes various modifications. For example, the above embodiment is described in detail for better understanding of the invention, and the invention is not necessarily limited to embodiments including all configurations described above.

Further, although an example of creating a program for implementing a part or all of the configurations, functions, and control system described above is mainly described, it is needless to say that a part or all of them may be implemented by hardware, for example, by designing an integrated circuit. That is, all or a part of functions of a processing unit may be implemented by, for example, an integrated circuit such as an application specific integrated circuit (ASIC) or a field programmable gate array (FPGA) instead of the program.

REFERENCE SIGNS LIST

10: SEM column
11: electron source
12: condenser lens
13: aperture
14: scanning deflector
15: objective lens
16: sample chamber
17: stage
18: sample
19: detector
20: input and output terminal
21: control system
210: control device
220: arithmetic device
230: drawing device
240: bus
30, 40: observation region
31, 41: block
32, 42: sampling point
33, 43: sampling path
70: scanning setting screen
80: image restoration adjustment screen
81: recommended region

The invention claimed is:
1. A sample image observation device, comprising:
scanning electron microscope (SEM) including:
an electron gun configured to emit an electron beam;
a detector configured to detect secondary electrons from a sample and generate detection signals of the secondary electrons; and
a computer, coupled to the SEM, programmed to:
divide an observation region of the sample into a plurality of sections,
determine a size of each section based on a spatial distribution of focal point positions of the electron beam for irradiation, and
execute restoration processing on an image which is acquired by irradiating each of a plurality of sections with the electron beam, based on scanning characteristics of the respective sections.
2. A sample image observation method using an SEM, the method comprising:

dividing an observation region of a sample into a plurality of sections;

determining a size of each section based on a spatial distribution of focal point positions of an electron beam for irradiation; and performing restoration processing on an image which is acquired by irradiating each section with the electron beam, based on scanning characteristics in the section.

3. The sample image observation device according to claim 1, wherein an irradiation position and an irradiation path of the electron beam with which each section is irradiated are different for each section.

4. The sample image observation device according to claim 1, wherein an irradiation position and an irradiation path of the electron beam with which the section is irradiated are the same for each section.

5. The sample image observation method according to claim 2, wherein an irradiation position and an irradiation path of the electron beam with which the section is irradiated are different for each section.

6. The sample image observation method according to claim 2, wherein an irradiation position and an irradiation path of the electron beam with which the section is irradiated are the same for each section.

7. The sample image observation device according to claim 1, wherein the size of each section includes an upper limit and a lower limit, wherein the computer is programmed to:

determine the upper limit of the size of each section based on a processing speed of the restoration processing, and determine the lower limit of the size of each section based on an accuracy of the restoration accuracy.

8. The sample image observation device according to claim 1, wherein the size of each section includes a lower limit, wherein the computer is programmed to determine the lower limit of the size of each section such that the following formula is satisfied: $pN - \sqrt{(pN)} > t$, wherein p is an irradiation density, N is a total number of pixels and t is a threshold having a value of 1 or more.

9. The sample image observation method according to claim 2, wherein the size of each section includes an upper limit and a lower limit, and wherein the method further comprises:

determining an upper limit of the size of each section based on a processing speed of the restoration processing; and determining a lower limit of the size of each section based on an accuracy of the restoration accuracy.

10. The sample image observation method according to claim 2, wherein the size of each section includes a lower limit, and wherein the method further comprises:

determining the lower limit of the size of each section such that the following formula is satisfied: $pN - \sqrt{(pN)} > t$, wherein p is an irradiation density, N is a total number of pixels and t is a threshold having a value of 1 or more.

* * * * *